United States Patent [19]
Golke et al.

[11] Patent Number: 5,410,501
[45] Date of Patent: Apr. 25, 1995

[54] READ-ONLY MEMORY

[75] Inventors: Keith W. Golke, Minneapolis; Malt MacLennan, Plymouth, both of Minn.

[73] Assignee: Honeywell Inc., Minneapolis, Minn.

[21] Appl. No.: 113,569

[22] Filed: Aug. 27, 1993

[51] Int. Cl.⁶ .............................................. G11C 17/12
[52] U.S. Cl. .................................... 365/104; 365/94; 365/203; 365/190; 365/202
[58] Field of Search ................... 365/94, 202, 203, 103, 365/104, 190, 184, 154, 189.05, 189.06, 205, 208

[56] References Cited

U.S. PATENT DOCUMENTS 4,599,704  7/1986  Mazin ................................. 365/184
5,053,997  10/1991  Miyamato et al. .................. 365/203

Primary Examiner—Don Hyun Yoo
Assistant Examiner—Huan Hoang
Attorney, Agent, or Firm—Gregory A. Bruns

[57] ABSTRACT

A plurality of memory cells arrayed in columns with the memory cells within a column connected between precharged first and second output lines. An input line selects a memory cell within a volume causing the first output line to be pulled to a first voltage when the cell is programmed a true and causing the second output line to be pulled to a first voltage when the cell is programmed a "complement". A pair of cross-coupled transistors connected between the first and second output lines of a column causes the second output line to be maintained at the precharged voltage when programmed a "true" and causes the first output line to be maintained at a precharged voltage when the cell is programmed a "complement".

15 Claims, 4 Drawing Sheets

READ-ONLY MEMORY

BACKGROUND OF THE INVENTION

The present invention relates to fixed information content memories often referred to as read-only memories (ROM) and, more particularly, to such memories which are subject to charge generating disturbances.

Radiation can be loosely categorized into long-term global radiation, short-term global radiation, and short-term local radiation. Short-term global radiation is typically ionizing photon or electron radiation and is called "dose rate". The effect of the dose rate is to generate large photocurrents in silicon circuits. The photo currents are collected by circuit nodes and may cause an undesirable change in logic state by charging or discharging of the node.

Various circuit approaches are utilized to reduce the effects of radiation of the various categories. Among these approaches is the construction of memory circuits to minimize the effects of the large photocurrents due to dose rate radiation. For example, limiting the volume of circuit material exposed to dose rate can limit the photocurrent collection. Bipolar ROM operates at high speed and can be made quite small thereby limiting the volume of material exposed to dose rate. For example, a prior art bipolar ROM can be constructed as a vertical PNP device with the bitline connected to the P+ emitter and the word line connected to the N+ base. However, the bitline of the ROM just described will be at approximately 0.6–0.7 volts after being discharged and this will create a high power to ground current in data sensing circuitry.

The use of silicon on insulator (SOI) technology permits the design of circuits which have the charge collection volume reduced vertically by the buried oxide layer. SOI technology provides a dramatic increase in dose rate upset hardness when compared to bulk technology. Circuits such as the previously described vertical PNP ROM cannot be processed in SOI technology.

The one transistor N-channel or P-channel ROM cell available in the commercial market typically has the gate connected to the word line and the drain connected to the bitline when programmed in one state and not connected to the bitline when programmed in the opposite state. When subjected to dose rate, all the memory cells connected to the bitline will collect photocurrent and the bitline voltage will change contrary to what is desired from the ROM cell programmed by not being connected to the bitline. A load cell can be added to the bitline to compensate the bitline photocurrent to maintain a high or low state as required, but this solution will create high power to ground current when the selected ROM cell state (cell connected to the bitline) is the opposite of the load cell state since the ROM cell must overdrive the load cell state. Even when a ROM using MOSFETS is implemented in SOI technology, and other dose rate resistant circuit layout and packaging techniques are used, there continues to be a significant risk due to photo currents generated by dose rate radiation causing an unwanted change in the bitline voltage. This unwanted change in bitline voltage is referred to as bitline sag. Bitline sag can result in data output error condition in a ROM.

Thus a need exists for a ROM cell that will reliably provide a full rail output voltage during dose rate and does not cause excessive power to ground current loading.

SUMMARY OF THE INVENTION

The present invention solves these and other needs by providing a nonvolatile memory device including a pair of output lines coupled to memory cells within a column with each memory cell including a pair of transistors of similar conductivity connected between the output lines. One transistor is always connected to one bitline and the other transistor is always connected to the other bitline to provide matched photocurrents between all output lines. The output lines are precharged high or low depending on the memory cell transistor conductivity. An input line connected to at least one gate of the transistor pair acting in combination with the method of connection of the transistor pair causes one output line to be pulled to a first voltage when the cell is programmed a true and to be pulled to a second voltage when the cell is programmed a complement. For each column of memory cells a pair of transistors of a conductivity type opposite the memory cell transistors causes an output line to be maintained at a high or low state depending on the memory cell transistor type.

DETAILED DESCRIPTION

Figure 1:
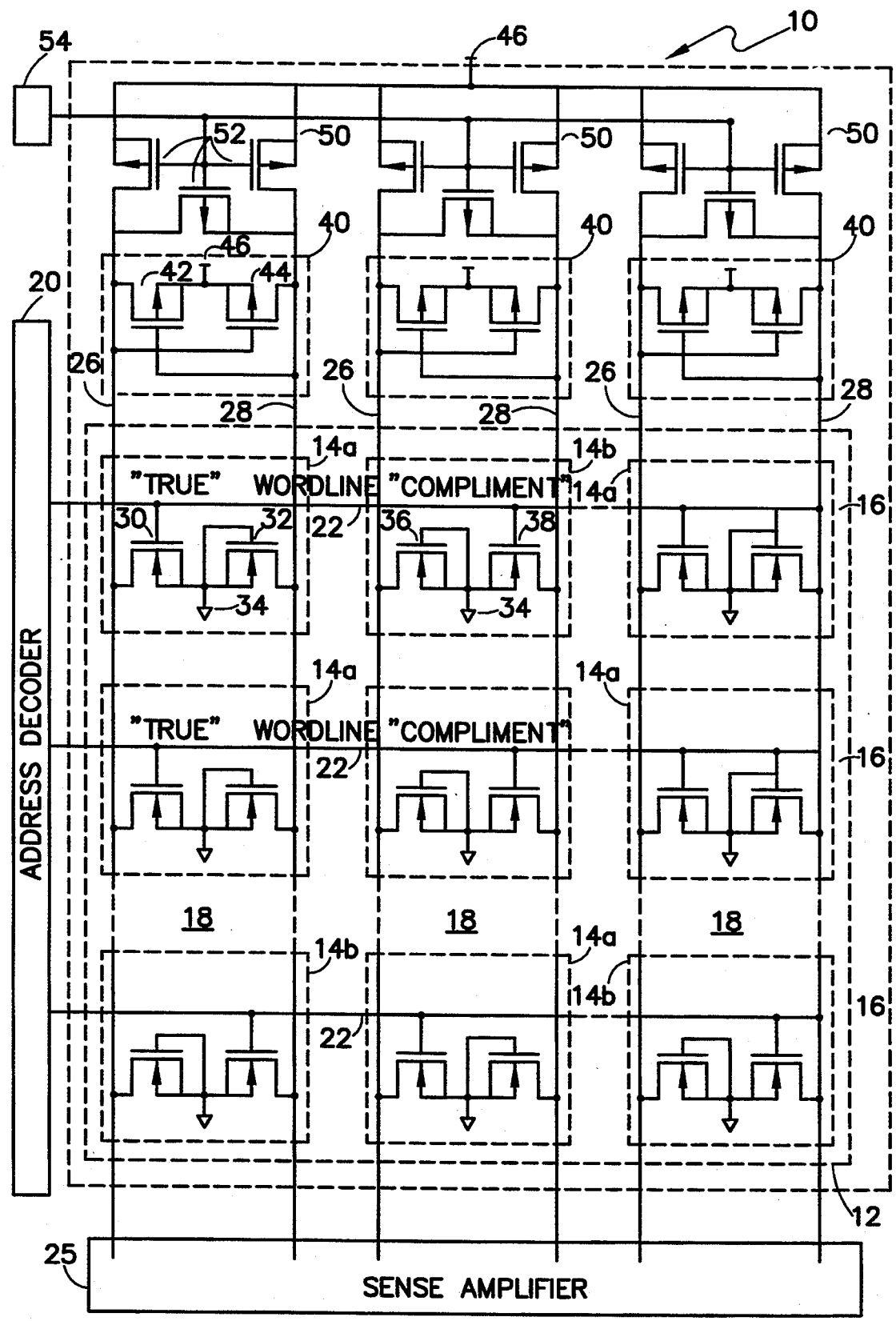
FIG. 1 is a schematic of a read-only memory according to the present invention.

An integrated circuit read-only memory (ROM) 10 is shown in the figures. ROM 10 includes an array 12 of memory elements or cells 14a, 14b arranged in a matrix of rows 16 and columns 18. Memory cells 14a have been programmed to store a "true" and memory cells 14b have been programmed to store a "complement". Address decoder 20 is a circuit selection means which enables or addresses a selected one of conductors or word lines 22 selectively in accordance with a signal from the digital system. Each one of the rows of memory cells 14a, 14b is connected to a corresponding one of word lines 22 as shown. Each memory cell 14a or 14b is connected between a pair of output lines which include a bitline 26 and a not bitline 28 which are connected to a sense amplifier within sense amplifier section 25.

During fabrication of ROM 10 as an integrated circuit, those memory elements 14a which are programmed to store a "true" have formed N-channel enhancement mode metal oxide semiconductor (MOS) field effect transistors 30 and 32. Transistor 30 is configured with its drain connected to bitline 26, its source connected to ground and its gate connected to word line 22. Transistor 32 has its drain connected to not bitline 28 and its source and gate connected to ground voltage reference 34. Those memory elements 14b which are programmed to store a "complement" have formed MOSFET transistors 36 and 38. Transistor 36 is configured with its drain connected to bitline 26 and its source and gate connected to ground voltage reference 34. Transistor 38 has its drain connected to not bitline 28, its source connected to ground reference voltage 34 and its gate connected to word line 22.

Each column 18 of ROM 10, according to the teachings of the present invention also includes a circuit 40 including P-channel transistors 42 and 44. Transistor 42 has its drain connected to output line 26, its source connected to a positive voltage source 46, for example $V_{DD}$ and its gate connected to not bitline 28. Transistor 44 has its drain connected to not bitline 28, its source connected to $V_{DD}$ and its gate connected to bitline 26. This arrangement is referred to hereinafter as cross coupled P-channel transistors. In an alternative embodiment described hereinafter cross coupled N-channel transistors are used. ROM 10 also includes a precharge circuit 50 for each column 18 of memory cells 14a and or 14b as shown in FIG. 1. Precharge circuit 50 includes P-channel MOSFETS 52 connected to precharge the output lines which include bitline 26 and not bitline 28 to a voltage of approximately positive voltage source 46. Precharge circuits 50 are controlled by precharge control means 54.

Now that the basic construction of ROM 10 has been set forth, the operation of ROM 10 may be described and appreciated. In operation, Precharge control means 54 activates precharge circuits 52 to precharge output lines 26 and 28 to the voltage of 46. Next a specific row of ROM 10 is selected according to decoder 20 which activates a word line 22. Memory cells 14a will have transistor 30 conduct to pull voltage of bitline 26 to ground reference voltage 34. Transistor 32 will not conduct and not bitline 28 will remain at the voltage of positive voltage source 46. In addition if the voltage of not bitline 28 should decrease or sag then transistor 44, which has its gate connected to bitline 26 which is low with respect to the source of transistor 44, conducts to maintain not bitline 28 at the full voltage of positive voltage source 46, for example $V_{DD}$. Memory cells 14b will have transistor 38 conduct to pull voltage of not bitline 28 to the voltage of ground voltage reference 34. Transistor 36 will not conduct and bitline 26 will remain at the voltage of positive voltage source 46. In addition, if the voltage of bitline 26 should decrease, then transistor 42, which has its gate connected to not bitline 28 which is low with respect to the source of transistor 42, conducts to hold bitline 26 at positive voltage source 46.

Figure 2:
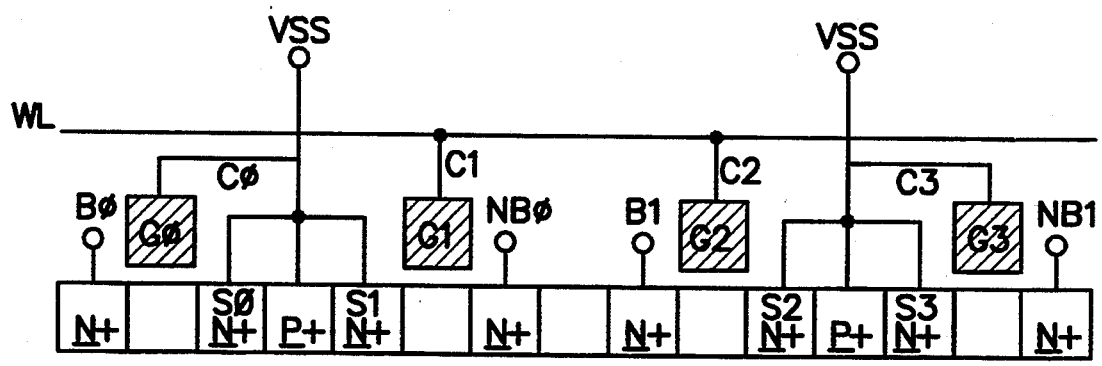
FIG. 2 is a cross-sectional drawing of the memory cells of FIG. 1.
Figure 2:
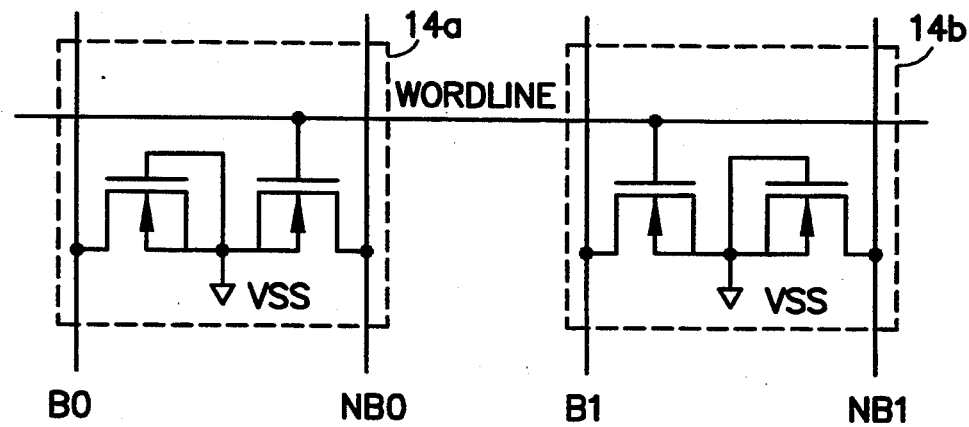

FIG. 2 illustrates memory cells 14a and 14b implemented in silicon on insulator (SOI) technology with C0, C1, C2 and C3 each indicating a connection; G0, G1, G2 and G3 each indicating a gate; and S0, S1, S2 and S3 each indicating a source.

Figure 3:
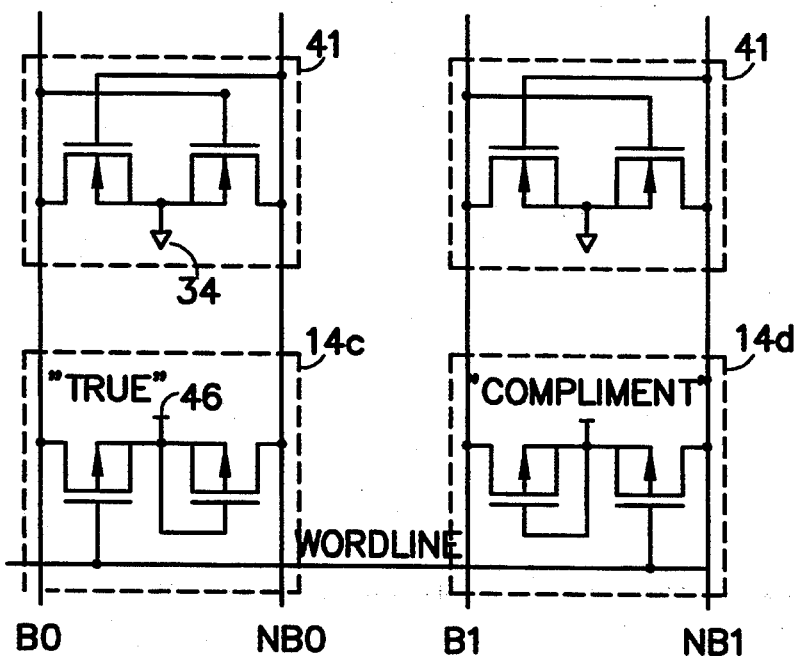
FIG. 3 is a schematic of illustrative memory cells of the present invention implemented with P-channel transistors.

The embodiment of Applicant's invention shown in FIG. 1 uses N-channel MOSFETS for the transistors of memory cells 14a and 14b. The invention can, of course, be implemented using P-channel MOSFETS for the transistors of memory cells 14a and 14b, and this is illustrated in FIG. 3. A representative memory cell 14c programmed as a true, a representative memory cell 14d programmed as a complement, and cross-coupled transistor circuit 41 are illustrated. In FIG. 3 all bitlines or output lines, i.e., B0, NB0, B1, and NB1 are precharged low and the word line charges either the bitline or not bitline depending on whether the ROM cell is programmed a "true" or a "complement". Cross coupled N-channel transistors 41 on the bitlines as illustrated in FIG. 3 are required to maintain a low state on the bitline.

Figure 4:
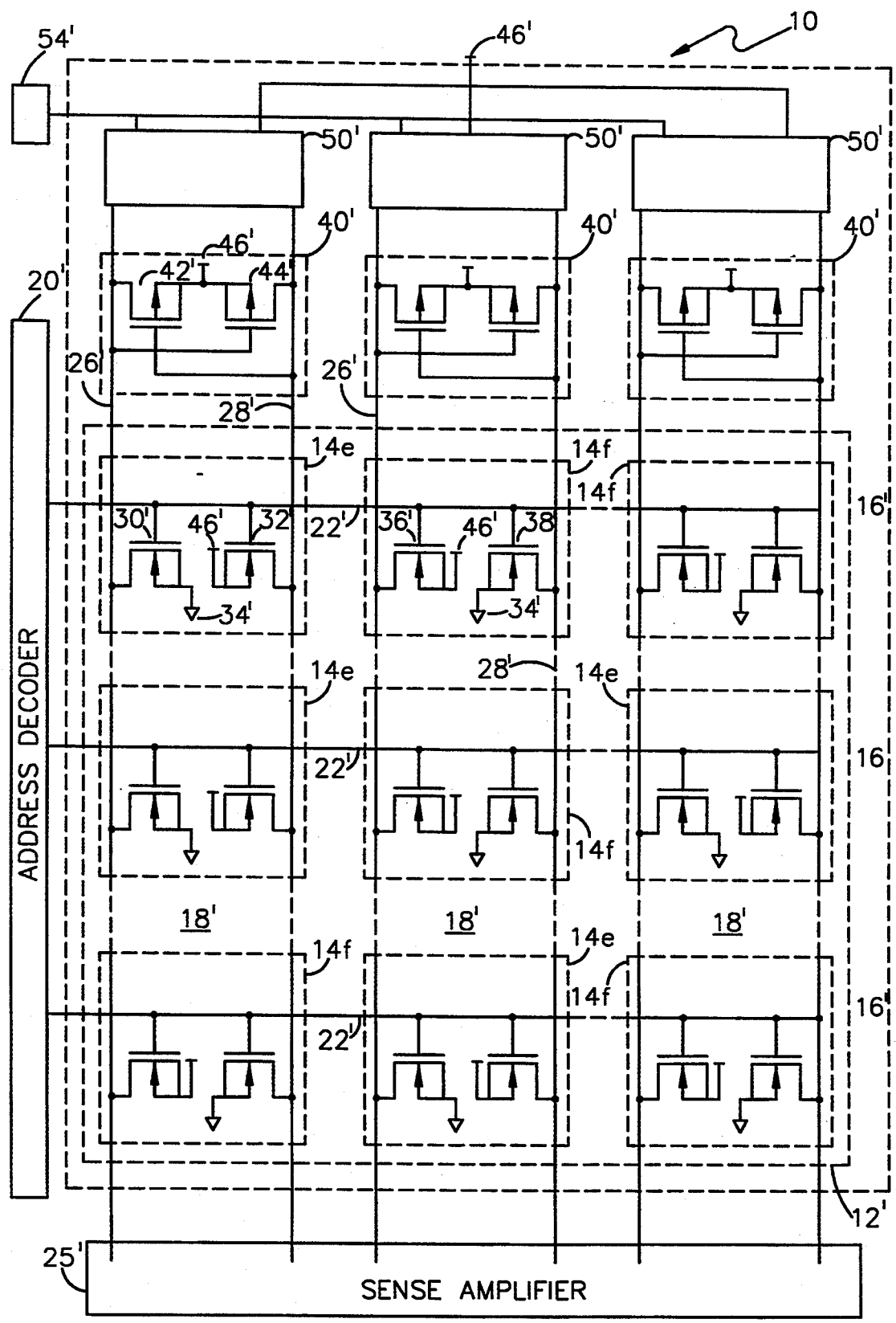
FIG. 4 is a schematic of illustrative memory cells for an alternative embodiment of the present invention.

An alternative embodiment of Applicants invention is illustrated in FIG. 4 where an integrated circuit read-only memory (ROM) 10 is shown in the figures. ROM 10 includes an array 12' of memory elements or cells 14e, 14f arranged in a matrix of rows 16' and columns 18'. Memory cells 14e have been programmed to store a "true" and memory cells 14f have been programmed to store a "complement". Address decoder 20' is a circuit selection means which enables or addresses a selected one of conductors or word lines 22' selectively in accordance with an address signal fed to address decoder 20'. Each one of the rows of memory cells 14e, 14f is connected to a corresponding one of word lines 22' as shown. Each memory cell 14e or 14f is connected between a pair of output lines which include a bitline 26' and a not bitline 28' which are connected to a sense amplifier within sense amplifier section 25'.

During fabrication of ROM 10 as an integrated circuit, those memory elements 14e which are programmed to store a "true" have formed N-channel enhancement mode metal oxide semiconductor (MOS) field effect transistors 30' and 32'. Transistor 30' is configured with its drain connected to bitline 26', its source connected to ground reference 34', and its gate connected to word line 22'. Transistor 32' has its drain connected to not bitline 28', its source connected to positive voltage source 46', and its gate connected to word line 22'. Those memory elements 14f which are programmed to store a "complement" have formed MOSFET transistors 36' and 38'. Transistor 36' is configured with its drain connected to bitline 26', and its source connected to positive voltage source 46', and its gate connected to word line 22'. Transistor 38' has its drain connected to bitline 28', its source connected to ground reference voltage 34' and its gate connected to word line 22'.

Each column 18' of ROM 10, according to the teachings of the present invention also includes a circuit 40' including transistors 42' and 44'. Transistor 42' has its drain connected to output line 26', its source connected to a positive voltage source 46', for example $V_{DD}$ and its gate connected to not bitline 28'. Transistor 44' has its drain connected to not bitline 28', its source connected to $V_{DD}$ and its gate connected to bitline 26'.

In operation, Precharge control means 54' activates precharge circuits 50' to precharge output lines 26' and 28' to the voltage of 46'. Next a specific row of ROM 10 is selected according to decoder 20' which activates a word line 22'. Memory cells 14e will have transistor 30' conduct to pull voltage of bitline 26' to ground reference voltage 34'. Transistor 32' will not conduct and not bitline 28' will remain at the voltage of positive voltage source 36'. In addition, if the voltage of not bitline 28' should decrease or sag then transistor 44', which has its gate connected to bitline 26' which is low with respect to the source of transistor 44', conducts to maintain not bitline 28' at the full voltage of positive voltage source 46', for example $V_{DD}$. Memory cells 14f will have transistor 38' conduct to pull voltage or not bitline 28' to the voltage of ground voltage reference 34'. Transistor 36' will not conduct and bitline 26' will remain at the voltage of positive voltage source 46'. In addition, if the voltage of bitline 26' should decrease, then transistor 42' which has its gate connected to not bitline 28' which is low with respect to the source of transistor 42', conducts to hold bitline 26' at positive voltage source 46'.

ROM 10 also includes a precharge circuit 50' for each column 18' of memory cells 14e and or 14f as shown in FIG. 4. Precharge circuit 50' includes P-channel MOSFETS connected to precharge the output lines which include bitline 26' and not bitline 28' to a high voltage. Precharge circuits 50' are similar to precharge circuits 50 of FIG. 1 and are controlled by precharge control means 54'.

Figure 5:
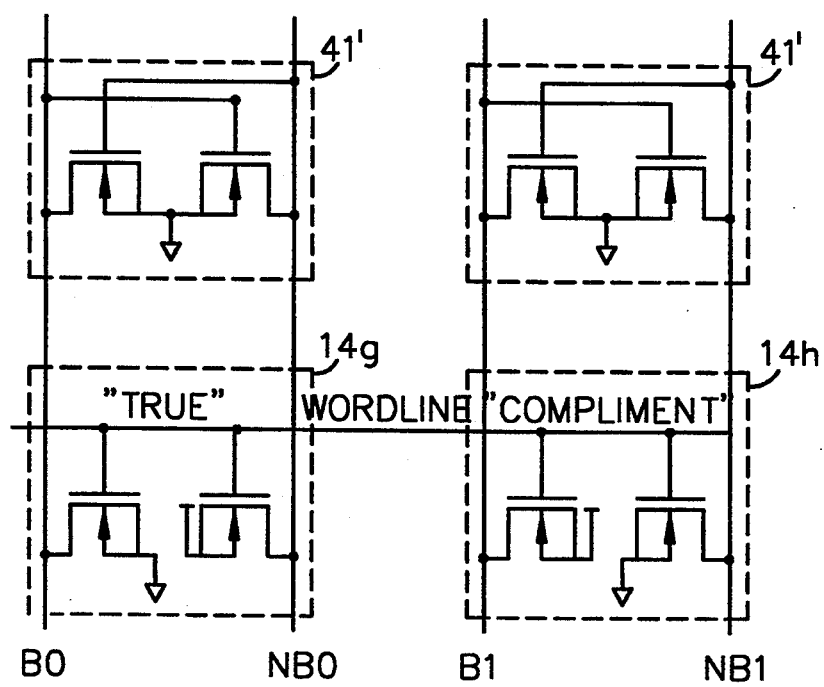
FIG. 5 is a schematic of illustrative memory cells for the alternative embodiment when implemented with P-channel transistors.

The alternative embodiment of Applicant's invention shown in FIG. 4 uses N-channel MOSFETS for the transistors of memory cells 14e and 14f. The invention can be implemented using P-channel MOSFETS for the transistors of the memory cells 14g and 14h and this is illustrated in FIG. 5. In FIG. 5 all bitlines or output lines, i.e., B0, NB0, B1 and NB1 are precharged low and the word line charges either the bitline or not bitline depending on whether the ROM cell is programmed a "true" or a "complement". Cross coupled N-channel transistors 41' on the bitlines are required to maintain a low state on the bitline.

In accordance with the foregoing description, Applicant has developed a ROM that can be implemented in bulk silicon or SOI technologies. ROM 10 will retain its correct data at a high level of radiation. Although specific embodiments of Applicant's invention have been shown and described for illustrative purposes, a number of variations and modifications will be apparent to those of ordinary skill in the relevant arts. It is not intended that coverage be limited to the disclosed embodiments, but only by the terms of the following claims.

We claim:

1. A nonvolatile memory device comprising:
   A plurality of memory cells arrayed in columns, each said memory cell comprising a first transistor and a second transistor, said first transistor having a first terminal, a second terminal and a gate terminal; said second transistor having a first terminal, a second terminal and a gate terminal;
   first and second output lines coupled to said memory cells within a column, with said first transistor first terminal connected to said first output line, said first transistor second terminal connected to a first voltage, said second transistor first terminal connected to said second output line, and said second transistor second terminal connected to a second voltage;
   means for precharging said first and second output lines to a third voltage;
   means for causing said first transistor to pull said first output line to said first voltage when said cell is programmed a true and for causing said second transistor to pull said second output line to said first voltage when said cell is programmed a complement; and
   means for maintaining said second output line at said third voltage when said cell is programmed a true, and for maintaining said first output line at said third voltage when said cell is programmed a complement.

2. Memory device of claim 2 wherein said means for maintaining said second output line at said third voltage when said cell is programmed a true, and for maintaining said first output line at said third voltage when said cell is programmed a complement comprises a third transistor and a fourth transistor said third and fourth transistors being of an opposite conductivity type from said first and second transistors, said third and fourth transistors cross coupled between said first output line and said second output line of each said column.

3. Memory device of claim 1 wherein said first voltage is equal to said second voltage and said means for causing said first transistor to pull said first output line to said first voltage when said cell is programmed a true and for causing said second transistor to pull said second output line to said first voltage when said cell is programmed a complement comprises an input line connected to said first transistor gate terminal and said first voltage connected to said second transistor gate terminal when said cell is programmed a true, and said input line connected to said second transistor gate terminal and said first voltage connected to said first transistor gate terminal when said cell is programmed a complement.

4. Memory device of claim 1 wherein said first voltage is not equal to said second voltage and said means for causing said first transistor to pull said first output line to said first voltage when said cell is programmed a true and for causing said second transistor to pull said second output line to a first voltage when said cell is programmed a complement comprises: an input line connected to both said first transistor gate terminal and said second transistor gate terminal;
   said second terminal of said first transistor connected to said first voltage and said second terminal of said second transistor connected to said second voltage when said cell is programmed a true; and said second terminal of said second transistor connected to said first voltage and said second terminal of said first transistor connected to said second voltage when said cell is programmed a complement.

5. Memory device of claim 3 wherein said first and second transistors are N-channel MOSFETS, said first voltage and said second voltage are ground reference voltages and said third voltage is a positive voltage.

6. Memory device of claim 4 wherein said first and second transistors are N-channel MOSFETS, said first voltage is a ground reference voltage, said second voltage is a positive voltage, and said third voltage is a positive reference voltage.

7. Memory device of claim 3 wherein said first and second transistors are P-channel MOSFETS said first voltage and said second voltage are positive voltages and said third voltage is a ground reference voltage.

8. Memory device of claim 4 wherein said first and second transistors are P-channel MOSFETS, said first voltage is a ground reference voltage, said second voltage is a positive voltage and said third voltage is said ground reference voltage.

9. A semiconductor read only memory device comprising:
   a plurality of word lines;
   a plurality of output lines intersecting said word lines;
   a plurality of memory cells arranged in a matrix arrangement of rows and columns with the memory cells within a column coupled to either a first output line or a second output line, each memory cell including a first transistor having a first terminal, a second terminal, and a gate, said first terminal connected to said first output line, said second terminal connected to a first voltage; a second transistor having a first terminal, a second terminal, and a gate, said first terminal connected to said second output line and said second terminal connected to said first voltage;

precharge means for charging said first and second output lines to a second voltage;

a word line connected to said first transistor gate and said second transistor gate connected to said first voltage when said memory cell is programmed a true, said word line connected to said second transistor gate and said first transistor gate connected to said first voltage when said memory cell is programmed a complement; and means for maintaining said second output line at said second voltage when said cell is programmed a true, and for maintaining said first output line at said second voltage when said memory cell is programmed a complement.

10. Memory device of claim 9 wherein said means for maintaining said second output line at said second voltage when said cell is programmed a true, and for maintaining said first output line at said second voltage when said cell is programmed a complement comprises a third transistor and a fourth transistor said third and fourth transistors being of an opposite conductivity type from said first and second transistors, said third and fourth transistors cross coupled between said first output line and said second output line of each said column.

11. Memory device of claim 10 wherein said first and second transistors are N-channel MOSFETS, said third and fourth transistors are P-channel MOSFETS, said first voltage is a ground reference voltage and said second voltage is a positive voltage.

12. Memory device of claim 10 wherein said first and second transistors are P-channel MOSFETS, said third and fourth transistors are N-channel MOSFETS, said first voltage is a positive voltage and said second voltage is a ground reference voltage.

13. A semiconductor read only memory device comprising:
a plurality of word lines;
a plurality of output lines intersecting said word lines;
a plurality of memory cells arranged in a matrix arrangement of rows and columns with the memory cells within a column coupled to a first output line and a second output line, each memory cell including a first transistor having a first terminal, a second terminal, and a gate, said first terminal connected to said first output line, said second terminal connected to a first voltage when said cell is programmed a true and to a second voltage when said cell is programmed a complement; a second transistor having a first terminal, a second terminal, and a gate, said first terminal connected to said second output line and said second terminal connected to said second voltage when said cell is programmed a true and to said first voltage when said cell is programmed a complement;

precharge means for charging said first and second output lines to a third voltage;

a word line connected to said first transistor gate and to said second transistor gate;

means for maintaining said second output line at said third voltage when said cell is programmed a true, and for maintaining said first output line at said third voltage when said memory cell is programmed a complement.

14. Memory device of claim 13 wherein said means for maintaining said second output line at said third voltage when said cell is programmed a true, and for maintaining said first output line at said third voltage when said cell is programmed a complement comprises a third transistor and a fourth transistor said third and fourth transistors being of an opposite conductivity type from said first and second transistors, said third and fourth transistors cross coupled between and first output line and said second output line of each said column.

15. Memory device of claim 14 wherein said first voltage is a ground reference voltage and said second voltage is a positive voltage when said memory cell is programmed a true, and said first voltage is said positive voltage and said second voltage is said ground reference voltage when said memory cell is programmed a complement.

* * * * *

UNITED STATES PATENT AND TRADEMARK OFFICE
CERTIFICATE OF CORRECTION

PATENT NO. : 5,410,501
DATED : April 25, 1995
INVENTOR(S) : Golke et al

It is certified that error appears in the above-indentified patent and that said Letters Patent is hereby corrected as shown below:

On the title page: Item [75] Inventors: should read
-- Mai T. MacLennan --.

Signed and Sealed this

Twelfth Day of September, 1995

Attest:

BRUCE LEHMAN

Attesting Officer

Commissioner of Patents and Trademarks